(12) United States Patent
Magnus et al.

(10) Patent No.: US 9,281,293 B2
(45) Date of Patent: Mar. 8, 2016

(54) MICROELECTRONIC PACKAGES HAVING LAYERED INTERCONNECT STRUCTURES AND METHODS FOR THE MANUFACTURE THEREOF

(71) Applicants: Alan J. Magnus, Gilbert, AZ (US); Trung Q. Duong, Austin, TX (US); Zhiwei Gong, Chandler, AZ (US); Scott M. Hayes, Chandler, AZ (US); Douglas G. Mitchell, Tempe, AZ (US); Michael B. Vincent, Chandler, AZ (US); Jason R. Wright, Chandler, AZ (US); Weng F. Yap, Phoenix, AZ (US)

(72) Inventors: Alan J. Magnus, Gilbert, AZ (US); Trung Q. Duong, Austin, TX (US); Zhiwei Gong, Chandler, AZ (US); Scott M. Hayes, Chandler, AZ (US); Douglas G. Mitchell, Tempe, AZ (US); Michael B. Vincent, Chandler, AZ (US); Jason R. Wright, Chandler, AZ (US); Weng F. Yap, Phoenix, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 149 days.

(21) Appl. No.: 14/067,809

(22) Filed: Oct. 30, 2013

(65) Prior Publication Data
US 2015/0115454 A1 Apr. 30, 2015

(51) Int. Cl.
*H01L 23/00* (2006.01)
*H01L 21/56* (2006.01)

(52) U.S. Cl.
CPC .............. *H01L 24/97* (2013.01); *H01L 24/19* (2013.01); *H01L 24/20* (2013.01); *H01L 24/96* (2013.01); *H01L 21/568* (2013.01); *H01L 2224/04105* (2013.01); *H01L 2224/12105* (2013.01); *H01L 2224/97* (2013.01); *H01L 2924/12042* (2013.01); *H01L 2924/181* (2013.01)

(58) Field of Classification Search
CPC ......... H01L 24/03; H01L 24/06; H01L 24/97; H01L 24/6895
USPC ........................................ 257/773; 438/115
See application file for complete search history.

(56) References Cited

U.S. PATENT DOCUMENTS

| 7,528,069 B2 | 5/2009 | Wenzel et al. |
| 2013/0087914 A1* | 4/2013 | Yang et al. ................... 257/738 |

* cited by examiner

*Primary Examiner* — Matthew W Such
*Assistant Examiner* — Warren H Kilpatrick
(74) *Attorney, Agent, or Firm* — Ingrassia Fisher & Lorenz, P.C.

(57) ABSTRACT

Microelectronic packages having layered interconnect structures are provided, as are methods for the fabrication thereof. In one embodiment, the method includes forming a first plurality of interconnect lines in ohmic contact with a first bond pad row provided on a semiconductor. A dielectric layer is deposited over the first plurality of interconnect lines, the first bond pad row, and a second bond pad row adjacent the first bond pad row. A trench via is then formed in the dielectric layer to expose at least the second bond pad row therethrough. A second plurality of interconnect lines is formed in ohmic contact with the second bond pad row within the trench via. The second plurality of interconnect lines extends over the first bond pad row and is electrically isolated therefrom by the dielectric layer to produce at least a portion of the layered interconnect structure.

20 Claims, 13 Drawing Sheets

MICROELECTRONIC PACKAGES HAVING LAYERED INTERCONNECT STRUCTURES AND METHODS FOR THE MANUFACTURE THEREOF

TECHNICAL FIELD

Embodiments of the present invention relate generally to microelectronic packaging and, more particularly, to microelectronic packages having layered interconnect structures, as well as to methods for the manufacture thereof.

BACKGROUND

Fan-out wafer level packaging ("FO-WLP") processes may involve the formation of redistribution layers over a molded package body in which one or more semiconductor die are embedded. The redistribution layers provide electrical interconnection between bond pads located on the semiconductor die and a contact array, such as a ball grid array, formed over a surface of the completed die package. The redistribution layers allow the bond pads to have a relatively tight pad-to-pad spacing and pitch, while still providing a comparably large surface area over which the contact array can be distributed or fanned-out. To produce the redistribution layers, one or more layers of dielectric material are initially deposited over the die and cover the bond pads. In one conventional approach, a separate via is etched through the dielectric layer to expose a portion of each contact pad, metal plugs or other conductors are then formed in each via to provide ohmic contact with the contact pad, and a metal trace or interconnect line is formed in contact with each conductor. More recently, an improved approach has been introduced wherein a single elongated via referred to as a "trench via" is formed to simultaneously expose multiple bond pads, which may be arranged in a row, through the overlying dielectric. Interconnect lines are then formed extending into the trench via and directly contact the bond pads exposed thereby. Such an approach allows the production of high density, fine pitch interconnect structures in a highly efficient and repeatable manner.

BRIEF DESCRIPTION OF THE DRAWINGS

At least one example of the present invention will hereinafter be described in conjunction with the following figures, wherein like numerals denote like elements, and.

Figure 1:
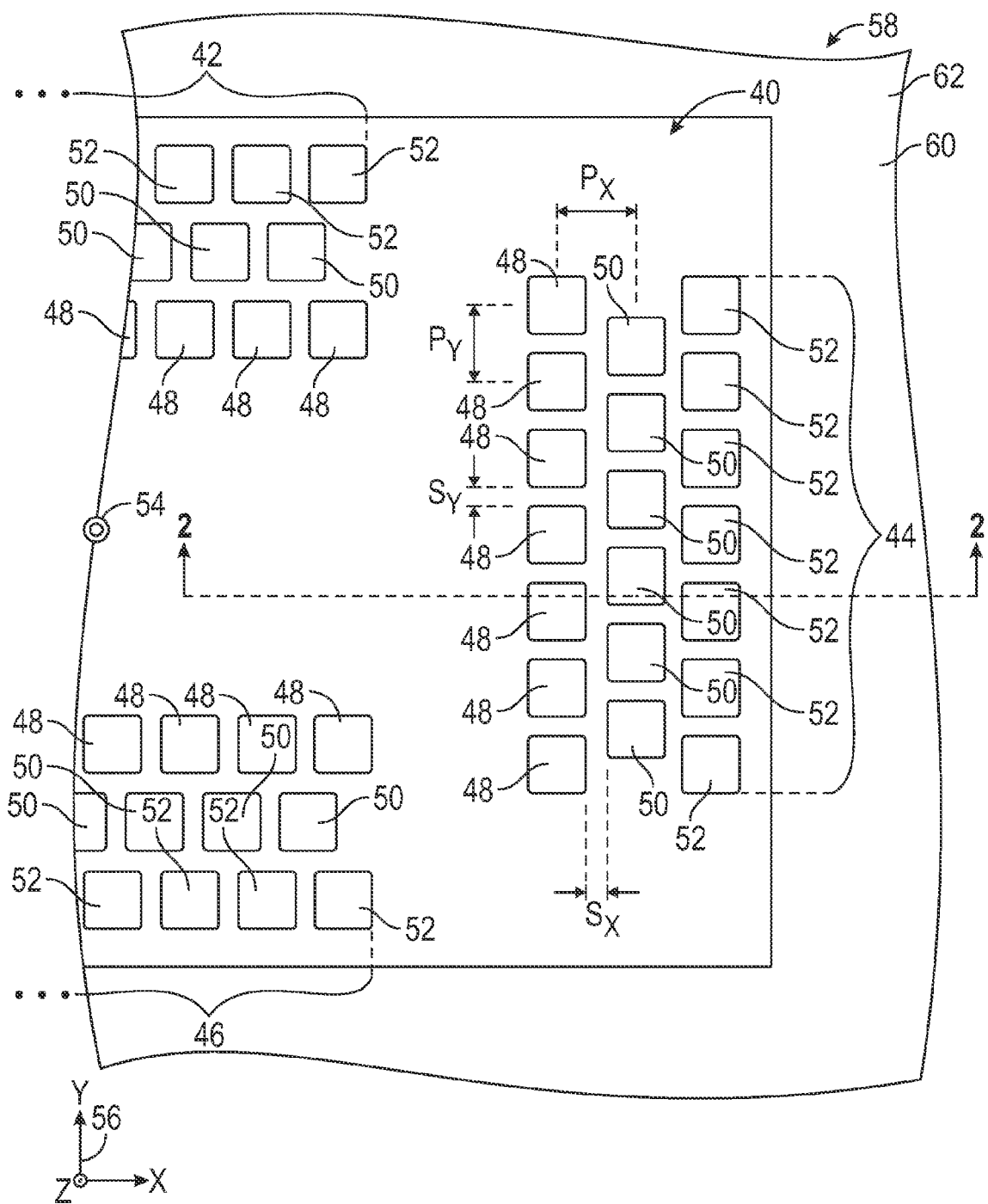
FIG. 1 is top-down view of an exemplary semiconductor die have a number of multi-row bond pad arrays disposed thereon.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following detailed description.

Terms such as "comprise," "include," "have," and the like are intended to cover non-exclusive inclusions, such that a process, method, article, or apparatus referred to as comprising, including, or having a list of elements is not necessarily limited to those elements, but may include other elements not expressly listed. The term "coupled," as appearing herein, is defined as directly or indirectly connected in an electrical or non-electrical manner. Furthermore, terms such as "over," "under," "on," and the like are utilized to indicate relative position between two structural elements or layers and not necessarily to denote physical contact between structural elements or layers. Thus, a first structure or layer may be described as fabricated "over" or "on" a second structure, layer, or substrate without indicating that the first structure or layer necessarily contacts the second structure, layer, or substrate due to, for example, presence of one or more intervening layers. Terms "first," "second," "third," "fourth," and the like, if appearing in the description and the subsequent claims, may be utilized to distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein.

As further appearing herein, the term "microelectronic device" refers broadly to an electronic device, component, or structure produced on a relatively small scale and amenable to packaging in the below-described manner. Microelectronic devices include, but are not limited to, integrated circuits formed on semiconductor die, Microelectromechanical Systems ("MEMS") devices, passive electronic components (e.g., discrete resistors, capacitors, and inductors), optical devices, and other small scale electronic devices capable of providing processing, memory, sensing, radio frequency, optical, and actuator functionalities, to list but a few examples. As still further appearing herein, the term "trench via" refers to an opening or window formed in a dielectric layer that exposes at least two bond pads contained within a single bond pad row. In most cases, the trench via will expose one or more bond pad rows in their entirety; however, this need not always be the case. A trench via may be referred to as "single wide" when exposing bond pads in a single bond pad row, "double wide" when exposing bond pads in each of two neighboring bond pad rows, "triple wide" when exposing bond pads in each of three neighboring bond pad rows, and so on. Finally, the statement that a plurality or plurality of interconnect lines is formed in ohmic contact with a given bond pad row indicates that the plurality of interconnect lines contacts at least one bond pad within the bond pad row and not necessarily that the plurality of interconnect lines contact every bond pad within the bond pad row.

FIG. 1 is a top-down view of a portion of an exemplary semiconductor die 40, which may be incorporated into a FO-WLP package of the type described below in conjunction with FIGS. 2-21. The illustrated region of semiconductor die 40 includes a first bond pad array 42 (partially shown in FIG. 1), a second bond pad array 44, and a third bond pad array 46 (also partially shown). Bond pad arrays 42, 44, and 46 extend along different edges of die 40 and each contain multiple rows of bond pads disposed adjacent one another. One or more additional bond pad arrays may also be located within the non-illustrated region of semiconductor die 40; e.g., a fourth bond pad array may extend along the non-illustrated edge of die 40 opposite bond pad array 44. The bond pad arrays formed on die 40 provide points-of-contact to one or more integrated circuits previously produced on die 40 during wafer level processing. With the exception of disposition and orientation, bond pad arrays 42, 44, and 46 are substantially identical in the relatively simple example set-forth in FIG. 1. This notwithstanding, the semiconductor die (or other microelectronic devices) packaged in accordance with the below-described embodiments of the package fabrication method can include any number of bond pad arrays that may differ in varying respects, providing that the packaged microelectronic device includes at least one bond pad array containing multiple rows of bond pads.

For ease of explanation, the following description focuses primarily on bond pad array 44. However, as bond pad arrays 42 and 46 are substantially identical to bond pad array 44, the following description is equally applicable to arrays 42 and 46. With continued referenced to FIG. 1, bond pad array 44 contains three neighboring rows of bond pads 48, 50, and 52, which are disposed in a side-by-side relationship. Bond pad row 48 is located closest to the centerline of semiconductor die 40, where the centerline is represented by symbol 54 and extends orthogonal the plane of the page in FIG. 1 (along the Z-axis identified by coordinate legend 56). For this reason, bond pad row 48 may be referred to herein below as the "inner bond pad row." Conversely, bond pad row 52 is located furthest from the die centerline 54 and may thus be referred to hereafter as the "outer bond pad row." Bond pad rows 48 and 52 may also be collectively referred as the "end bond pad rows" or the "terminal bond pad rows" herein below as bond pad rows 48 and 52 flank or border bond pad row 50. Finally, bond pad row 50 may further be referred to herein as the "middle bond pad row" in view of its disposition between bond pad rows 48 and 52. While including a single middle bond pad row 50 in the embodiment of bond pad array 44 shown in FIG. 1, bond pad array 44 (and the other bond pad arrays disposed on die 40) can be produced to include multiple middle rows of bond pads in further embodiments.

Bond pad rows 48, 50, and 52 extend along substantially parallel axes, which are substantially parallel with the neighboring edge of die 40 along which array 44 is disposed (the rightmost edge of die 40 in illustrated orientation shown in FIG. 1). Bond pad rows 48, 50, and 52 may be staggered such that the bond pads within adjacent rows are offset or non-aligned, as taken along an axis perpendicular to the longitudinal axis of each row (corresponding to the X-axis in coordinate legend 56 in the case of array 44). In the illustrated example, bond pad array 44 is produced to have a rectangular planform shape, terminal bond pad rows 48 and 52 each contain a total of seven bond pads, and middle bond pad row 50 contains a total of six bond pads; however, it will be appreciated that the number of bond pads included within each bond pad row will vary amongst embodiments, as will the number of bond pad rows, and the planform shape and dimensions of bond pad array 44 and the other bond pad arrays distributed over the frontside of semiconductor die 40.

It is generally desirable to minimize the pitch between adjacent bond pads contained within rows 48, 50, and 52 (identified in FIG. 1 as dimension "$P_Y$"). In the context of this document, a bond pad row is considered "fine pitch" when the pitch ($P_Y$) between adjacent bond pads is less than 100 microns (μm) and "very fine pitch" when the pitch is less than 50 μm. The spacing or clearance between adjacent bond pads in a given bond pad row (further identified in FIG. 1 as dimension "$S_Y$") is determined by the pitch ($P_Y$) of the pad row and bond pad size. Embodiments of the below-described fabrication method can be utilized to package semiconductor die having at least two neighboring rows of bond pads, regardless of pitch and pad-to-pad spacing. However, as explained more fully below, the fabrication method is usefully employed to package semiconductor die, such as die 40 shown in FIG. 1, including two or more bond pads rows having a fine pitch or very fine pitch. For completeness, the row-to-row pitch for bond pad array 44 is further identified in FIG. 1 as dimension "$P_X$," and the row-to-row spacing or clearance for array 44 is identified as "$S_X$." $P_X$ and $S_X$ will often be equivalent to $P_Y$ and $S_Y$, respectively; however, this need not always be the case.

Assuming that bond pad size is held constant, the spacing or clearance between adjacent bond pads decreases as a function of pitch ($P_Y$). While bond pad size can be reduced to increase the pad-to-pad spacing ($S_Y$) within certain limits, $S_Y$ will typically be a fraction of $P_Y$. For example, in embodiments wherein the bond pad rows have a very fine pitch ($P_Y$<50 μm), $S_Y$ will often be less than 5 μm (although $S_Y$ will remain above a minimum threshold value, such as 1 μm, to ensure adequate electrical isolation between bond pads). Such a narrow pad-to-pad spacing generally precludes or at least renders impractical the ability to route interconnect lines between adjacent bond pads. Thus, in instances wherein a given bond pad array contains three or more rows with at least the terminal bond pad rows having a fine pitch ($P_Y$<100 μm) or very fine pitch ($P_Y$<50 μm), an entrapment condition may occur wherein conventional trench via fabrication methods of the type described in the foregoing section entitled "BACKGROUND" provide no practical means to route interconnect lines to all but the first and last bond pads within the middle row or rows. As a result, conventional trench via fabrication methods are generally incapable of producing high density interconnect structures over bond pad arrays containing three or more fine pitch bond pad rows, such as bond pad array 44 shown in FIG. 1.

To overcome the above-described limitations, the following describes methods of fabricating microelectronic packages wherein layered interconnect structures are produced over bond pad arrays containing at least two adjacent rows of bond pads. Embodiments of the below-described fabrication method may be advantageously employed to produced layered interconnect structures over bond pad arrays containing three or more rows of bond pads with at least the terminal bond pad rows having a fine pitch ($P_Y<100$ µm) or very fine pitch ($P_Y<50$ µm). This notwithstanding, embodiments of the below-described fabrication method may provide other benefits in addition to allowing interconnection to middle bond pad rows located between fine pitch terminal bond pad rows. Such additional benefits may include, but are not limited to: (i) the ability to form direct electrical connections between the bond pads and interconnect lines overlying the first or "$M_1$" metal level within the redistribution layers, and (ii) the ability to form direct electrical connections between one or more bond pads within a bond pad row and interconnect lines formed in conjunction with different metal levels. Embodiments of the below-described fabrication method can thus be usefully employed to package semiconductor die (or other microelectronic devices) having multi-row bond pad arrays wherein $P_Y$, $S_Y$, $P_X$, and/or $S_X$ exceed the aforementioned ranges and/or wherein a given bond pad array contains only two rows of bond pads.

To provide a convenient, albeit non-limiting example, the following will describe several embodiments of the fabrication method in conjunction with the packaging of semiconductor die 40 shown in FIG. 1. In each of the below-described fabrication methods, semiconductor die 40 is embedded or encapsulated within an electrically-insulative package body, such as a molded package body. The package body is conveniently produced utilizing an "overmolding" or "panelization" process during which die 40 is embedded within a relatively large molded panel along with a number of other microelectronic devices, which may or may not be substantially identical to die 40. In one implementation, the molded panel is produced as follows. First, die 40 and the other microelectronic devices are positioned in a spatial array with their bond pads in contact with the surface of a temporary substrate, such as a taped frame or carrier. A mold frame, which has a central cavity or opening therein, is positioned over the temporary substrate and around the microelectronic devices disposed thereon. An electrically-insulative encapsulant or mold compound, such as a silica-filled epoxy, is dispensed into the cavity of the mold frame. Alternatively, a compression molding can be utilized to encapsulate die 40 and the other microelectronic devices. The encapsulant flows over and around semiconductor die 40 and the other devices placed on the substrate. Sufficient volume of the encapsulant is typically dispensed over die 40 (and the other microelectronic devices) to enable the encapsulant to flow over the backside or non-contact-bearing surfaces of die 40. The encapsulant may then be solidified by thermal curing (e.g., heating in a partially-evacuated chamber) to yield a solid molded panel in which die 40 is embedded. The molded panel is conveniently produced as a relatively thin, disc-shaped body or mass having a generally circular planform geometry; however, the panel body can be fabricated to have any desired shape and dimensions. The molded panel is released from the frame or carrier to reveal the panel frontside through which the bond pads of die 40 and the other microelectronic devices are exposed. The molded panel may then be inverted and subject to further processing to produce a number of redistribution layers ("RDL layers"), as described more fully below. In further embodiments, the molded panel can be produced utilizing various other known fabrication techniques including lamination processes.

Figure 2:
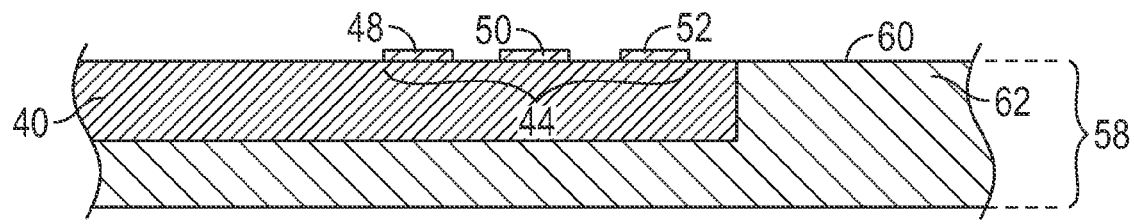
FIGS. 2-7 illustrate a microelectronic package (shown at various stages of completion) containing the semiconductor die shown in FIG. 1 and produced in accordance with a first exemplary embodiment of the package fabrication method.

FIG. 2 is a cross-sectional view of semiconductor die 40 and a molded panel 58 (taken along line 2-2 in FIG. 1), which may be produced pursuant to the above-described panelization process. While a relatively limited portion of panel 58 surrounding semiconductor die 40 is shown in FIG. 2 for clarity, it will be understood that molded panel 58 will typically be considerably larger than the illustrated portion and that additional microelectronic devices (e.g., other semiconductor die) are distributed throughout the non-illustrated portions of panel 58. Molded panel 58 includes a frontside 60 through which semiconductor die 40 is exposed. The illustrated portion of panel 58 also includes a fan-out region 62, which circumscribes or surrounds die 40 and which increases the area over which the RDL layers, a frontside contact array, and/or a backside contact array may be formed. The other, non-illustrated microelectronic devices embedded within molded panel 58 may likewise be surrounded by fan-out regions and exposed through panel frontside 60.

As indicated above, one or more RDL layers are built-up over frontside 60 of molded panel 58. The RDL layers are produced to include a series of interconnect lines, which provide electrical communication with the microelectronic devices embedded within panel 58 and one or more contact arrays later formed over panel 58. In accordance with embodiments of the present invention, layered interconnect structures are fabricated in conjunction with build-up of the RDL layers. One such layered interconnect structure is produced over bond pad array 44 to enable electrical interconnection to bond pad rows 48, 50, and 52, even when one or all of rows 48, 50, and 52 are produce to have a tight pitch and relatively narrow pad-to-pad spacing. A first exemplary subprocess that can be performed to produce a layered interconnect structure over bond array 44 will now be described in conjunction with FIGS. 3-7. While the following description focuses primarily on the fabrication of a single interconnect structure over a single bond pad array disposed on die 40 (i.e., bond pad array 44), it will be understood the below-described processing steps can be performed globally across molded panel 58 to produce similar interconnect structures over the other multi-row bond pad arrays located on semiconductor die 40 (e.g., bond pad arrays 42 and 46 shown in FIG. 1) and/or multi-row bond pad arrays located on other microelectronic devices embedded within panel 58.

Figure 3:
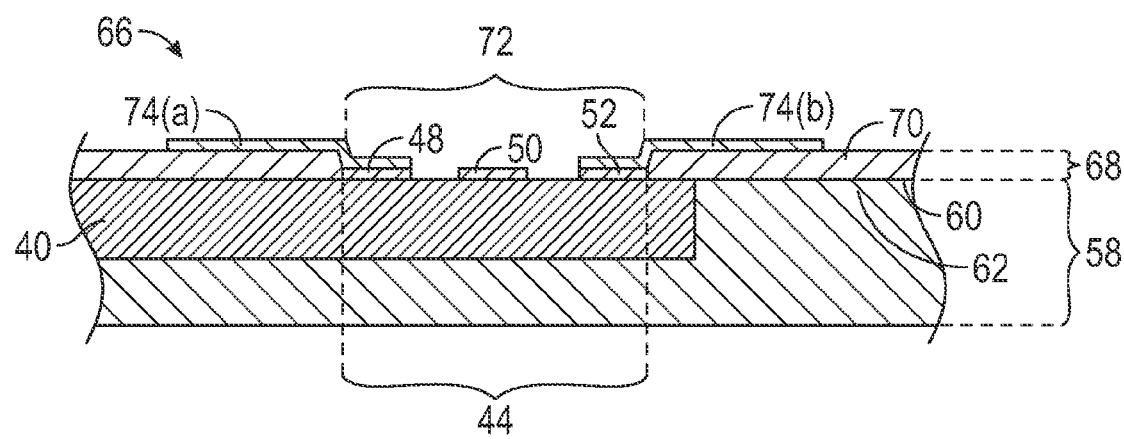
Figure 4:
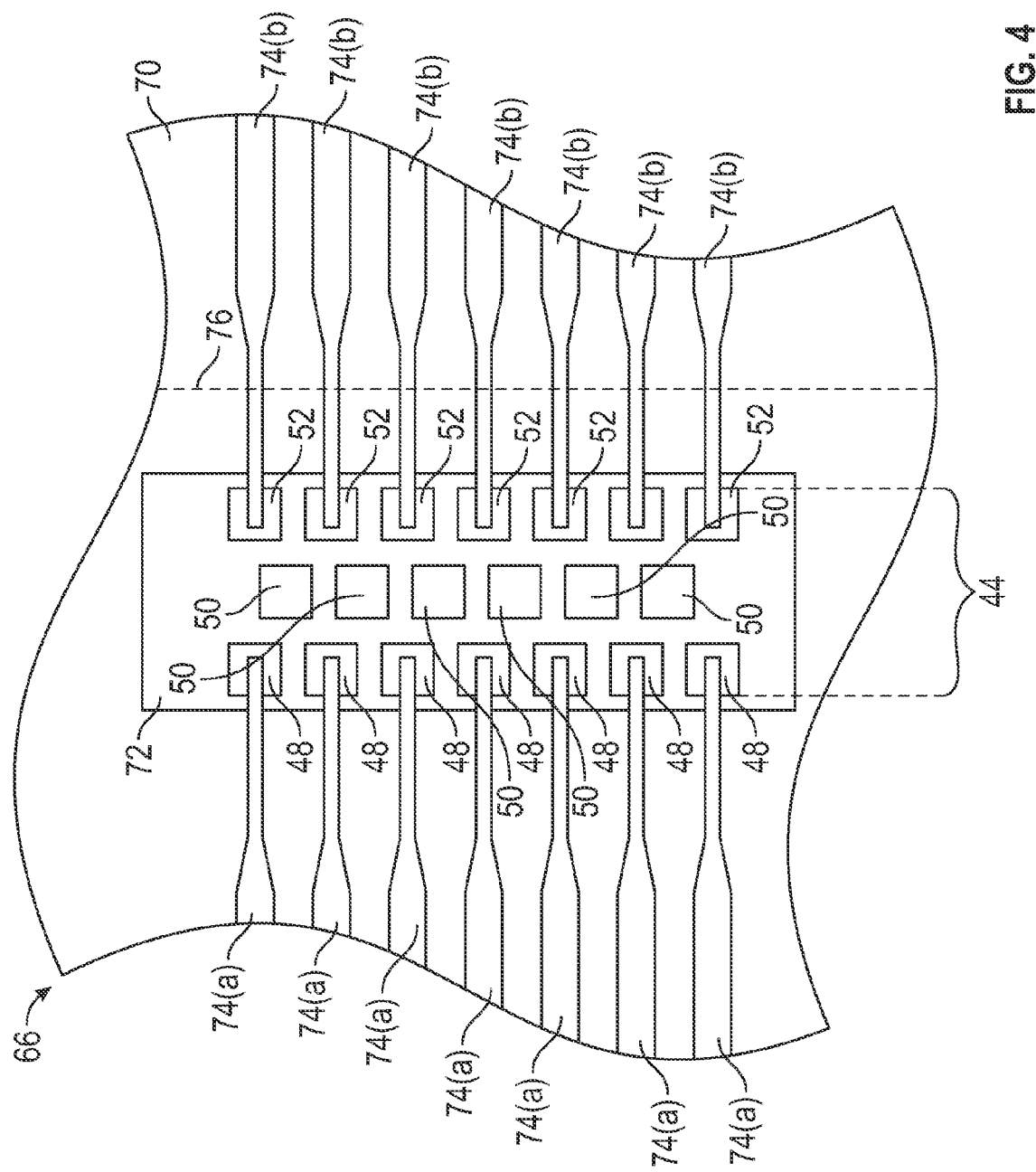

FIGS. 3-7 illustrate a first exemplary FO-WLP package 66 (shown at various stages of completion) into which semiconductor die 40 may be incorporated in accordance with an exemplary embodiment of the package fabrication method. FO-WLP package 66 is fabricated to include a number of RDL layers 68 overlying semiconductor die 40 and bond pad array 44. Referring initially to FIG. 3, build-up of RDL layers 68 commences with the deposition of a first dielectric layer 70 over the frontside 60 of molded panel 58 and the microelectronic device exposed therethrough; e.g., dielectric layer 70 may be applied utilizing a spin-on technique. Dielectric layer 70 covers bond pad array 44 and the other bond pad arrays located on the frontside of die 40. After deposition of layer 70, an elongated trench via 72 is patterned and etched into dielectric layer 70 to expose bond pad array 44 therethrough. Elongated trench via 72 is formed to have a width sufficient to expose bond pad rows 48, 50, and 52 and is consequently referred to herein as a "triple wide" trench via. As may be appreciated most readily by referring to FIG. 4, which is a top-down view of the region of partially-completed FO-WLP package 66, trench via 72 may be formed to a length equal to or greater than the respective lengths of bond pad rows 48, 50, and 52; and to have a width equal to or greater than the combined width of rows 48, 50, and 52. Additionally, elongated trench via 72 may be produced to have a generally rectangular planform geometry; however, the dimensions and shape of trench via 72 can vary in conjunction with the relative dispositions, sizes, and number of the bond pad rows included within array 44. To provide a frame of reference, the edge of die 40 located adjacent bond pad array 44 is represented in FIG. 4 by dashed line 76.

A first plurality of interconnect lines 74(*a*), 74(*b*) (collectively 74) is produced in ohmic contact with bond pad rows 48 and 52. Interconnect lines 74 are referred to herein as "$M_1$ interconnect lines 74" in view of their formation after the initially-deposited RDL dielectric layer 70. $M_1$ interconnect lines 74 may be produced by patterning a mask layer deposited over a seed layer (not shown for clarity), plating exposed regions of the seed layer, and then removing the mask layer to define the interconnect lines as metal (e.g., copper) traces. This notwithstanding, $M_1$ interconnect lines 74 (and the other interconnect lines described herein) can be fabricated utilizing any process capable of producing electrically-conductive routing features suitable for providing electrical communication with the bond pads formed on a semiconductor die, such as die 40 shown in FIGS. 1-4. $M_1$ interconnect lines 74 are comprised of two subsets or pluralities: (i) a first plurality of $M_1$ interconnect lines 74(*a*) formed in direct ohmic contact with the bond pads of outer bond pad row 52, and (ii) a second plurality of $M_1$ interconnect lines 74(*b*) formed in contact with outer bond pad row 48. $M_1$ interconnect lines 74(*a*) extend from inner bond pad row 48 in a direction inward of semiconductor die 40; that is, toward die centerline 54 identified in FIG. 1. In contrast, interconnect lines 74(*b*) extend outward of die 40 away from die centerline 54 in a direction opposite interconnect lines 74(*a*); that is, toward the neighboring fan-out region 62 of molded panel 58. If desired, the terminal ends of $M_1$ interconnect lines 74 contacting bond pad rows 48 and 50 may have narrowed widths to help maintain electrical isolation between neighboring interconnect lines within trench via 72. While each $M_1$ interconnect lines 74 is shown as contacting a single bond pad in the illustrated embodiment, it will be appreciated that one or more of $M_1$ interconnect lines 74 (or the other interconnect lines described herein) can be produced to have an increased width at their terminal ends to contact two or more neighboring bond pads contained within a given bond pad row and/or an increased length at their terminal ends to contact neighboring bond pads contained within adjacent bond pad rows.

Figure 5:
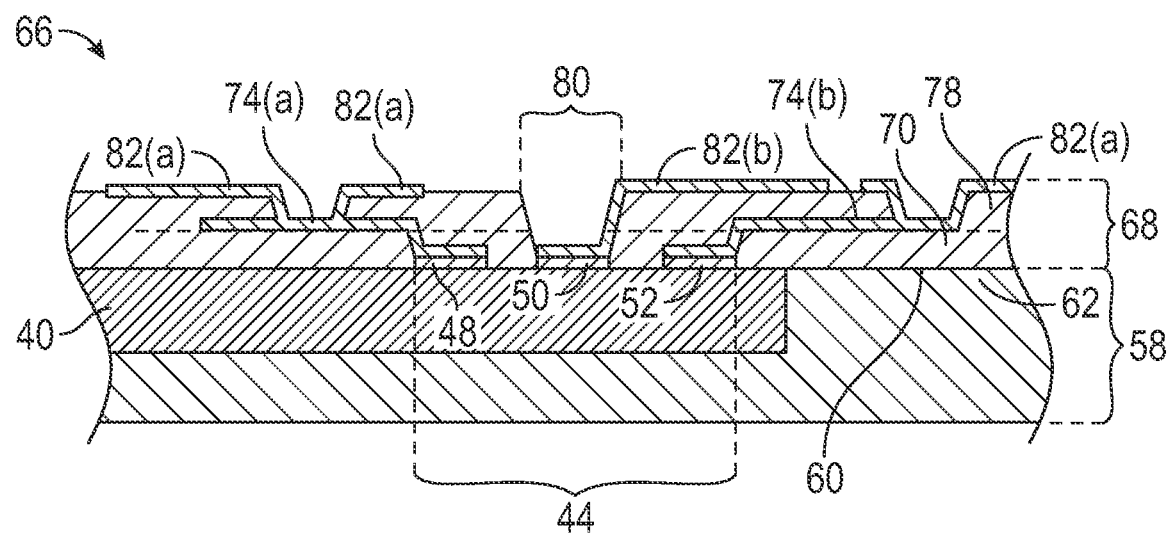
Figure 6:
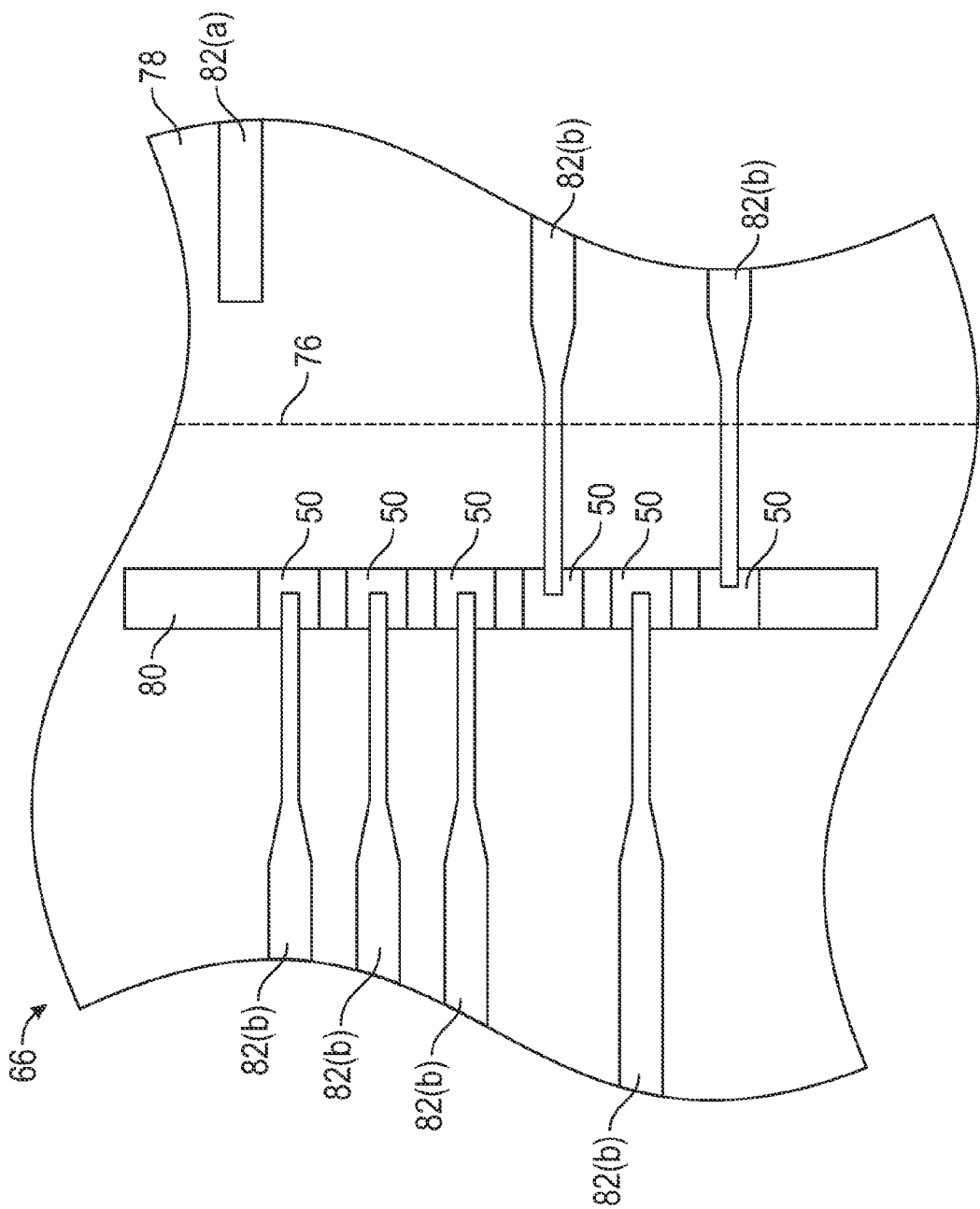

Advancing to FIGS. 5 and 6, a second RDL dielectric layer 78 is next spun-on or otherwise deposited over the upper surface of partially-completed FO-WLP package 66 and, specifically, over dielectric layer 70 and $M_1$ interconnect lines 74. A dashed line is shown in FIG. 5 to visually delineate the boundary between dielectric layer 78 and underling dielectric layer 70. Additionally, RDL dielectric layer 78 fills elongated trench via 72 (identified in FIGS. 3 and 4) to once again cover bond pad rows 48, 50, and 52 of array 44. A single wide trench via 80 is next formed in dielectric layer 78 to expose middle bond pad row 50, while leaving intact the portions of layer 78 overlying terminal bond pad rows 48 and 52. Specifically, and as shown most clearly in FIG. 6, single wide trench via 80 is formed to have a length sufficient to expose the bond pads within row 50, while having a reduced width as compared triple wide trench via 72 (FIGS. 3 and 4). As may be appreciated by comparing FIG. 6 to FIG. 4, the location at which single wide trench via 80 is formed within RDL layers 68 overlaps with the location at which triple wide trench via 72 was previously formed within layers 68.

Additional interconnect lines 82(*a*), 82(*b*) (collectively 82) are now formed in ohmic contact with some or all of the bond pads included within middle bond pad row 50. As interconnect lines 82 are formed in conjunction with the second metal level of RDL layers 68, interconnect lines 82 may be referred to as "$M_2$ interconnect lines" hereafter. Certain $M_2$ interconnect lines 82(*a*) may not contact bond pad row 50 and, instead, may be formed in ohmic contact with $M_1$ interconnect lines 74 to further complete the desired routing scheme within RDL layers 68 (FIG. 5). Other $M_2$ interconnect lines 82(*b*) extend into trench via 80 to contact one or more bond pad contained within row 50. As shown most clearly in FIG. 6, $M_2$ interconnect lines 82(*b*) may extend from bond pad row 50 in an inward or inboard direction (toward die centerline 54), in outward or outboard direction (toward the neighboring fan-out region 62 of molded panel 58), or a combination thereof. This affords a high degree of flexibility in the routing interconnect lines 82(*b*) extending from middle bond pad row 50. Additionally, by virtue of the instant fabrication method, a direct electrical connection can be formed between $M_2$ interconnect lines 82(*b*) and middle bond pad row 50.

Figure 7:
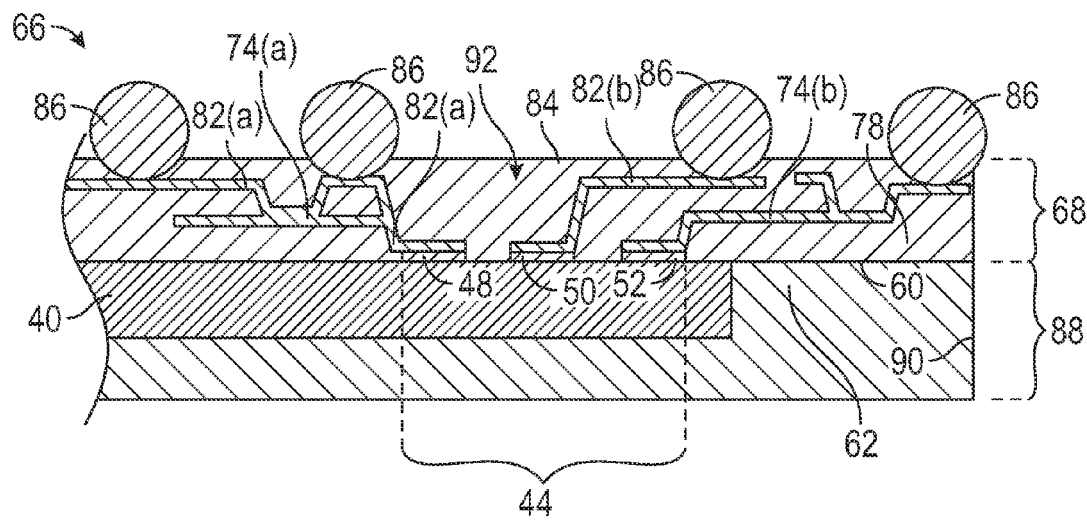

Additional dielectric layers and metal levels may be produced over the upper surface of FO-WLP package 66, as needed, to satisfy the routing requirements of package 66 (FIGS. 5 and 6). In the illustrated embodiment wherein RDL layers 68 contain only two metal levels, and referring to FIG. 7, a final dielectric layer 84 (e.g., a capping or passivation layer) is next deposited over dielectric layer 84 thereby covering $M_2$ interconnect lines 82 and filling trench via 80. An externally-accessible contact array is then formed over RDL layers 68. For example, as shown in FIG. 7, a bumping process may be utilized to produce a Ball Grid Array (BGA) including a plurality of solder balls 86 over the topside of FO-WLP package 66. In further embodiments, the contact array may assume other forms suitable for providing externally-exposed points-of-contact to the interconnect lines within RDL layers 68, such as externally-exposed bond pads in ohmic contact with the RDL interconnect lines or portions of the RDL interconnect lines themselves, which are exposed through the uppermost RDL dielectric or passivation layer. Finally, to complete fabrication of FO-WLP package 66 and the other packages produced in parallel therewith, molded panel 58 may be singulated using a dicing saw, laser cutting, or another dicing technique. The singulated piece of molded panel 58 included within FO-WLP package 66 thus serves as a molded package body 88. As indicated in FIG. 7, package body 88 includes substantially vertical sidewalls 90 defined by singulation of panel 58.

The completed FO-WLP package 66 contains at least one high density, layered interconnect structure 92 (FIG. 7), which is produced within RDL layers 68 over multi-row bond pad array 44. Interconnect structure 92 is "layered" in the sense that structure 92 includes at least first and second pluralities of interconnect lines, which are each formed in contact with at least one bond pad row and which vertically overlap, as taken along an axis orthogonal to the frontside of die 40 or the upper surface of RDL layers 68. Stated differently, interconnect structure 92 includes a first plurality of interconnect lines (e.g., $M_2$ interconnect lines 82(*b*)) formed in direct ohmic contact with at least one bond pad row (e.g., middle bond pad row 50), where the first plurality of interconnect lines extends over one or more bond pad rows (e.g., terminal bond pad rows 48 and 52) contacted by an additional plurality or pluralities of interconnect lines (e.g., $M_1$ interconnect lines 74(*a*) and 74(*b*), respectively). In this manner, $M_2$ interconnect lines 82(*b*) may be routed to middle bond pad row 50 without extending between or in close proximity to adjacent bond pads within terminal bond pad row 48 or terminal bond pad row 52. Consequently, a highly dense interconnect structure can be produced to provide electrical connection to all bond pads included within array 44 even when terminal bond pad rows 48 and 52 have a tight pitch and narrow pad-to-pad spacing. The above-described fabrication method also enables direct ohmic connection between the bond pads of middle bond pad row 50 and interconnect lines formed above the $M_1$ metal level; i.e., $M_2$ interconnect lines 82(b) shown in FIG. 7. As a still further benefit, the above-described fabrication method allowed $M_2$ interconnect lines 82(b) to be routed inward and/or outward of die 40.

In the above-described exemplary embodiment, the interconnect lines routed to a given bond pad row were formed in conjunction with a single metal level; e.g., as shown in FIG. 7, only $M_1$ interconnect lines 74 were formed in direct ohmic contact with the bond pads of terminal rows 48 and 52, and only $M_2$ interconnect lines 82 were formed in contact with the bond pads of middle row 50. However, in further embodiments, the package fabrication method may enable interconnect lines formed in conjunction with multiple different metal levels to be produced in direct ohmic contact with one or more bond pads contained within a single bond pad row. To further emphasize this point, an additional exemplary embodiment of the package fabrication method will now be described in conjunction with FIGS. 8-11 wherein interconnect lines are formed in conjunction with multiple metal levels (e.g., the $M_1$ and $M_2$ metal levels) and produced in direct ohmic contact with one or more bond pads contained within the same bond pad row.

Figure 8:
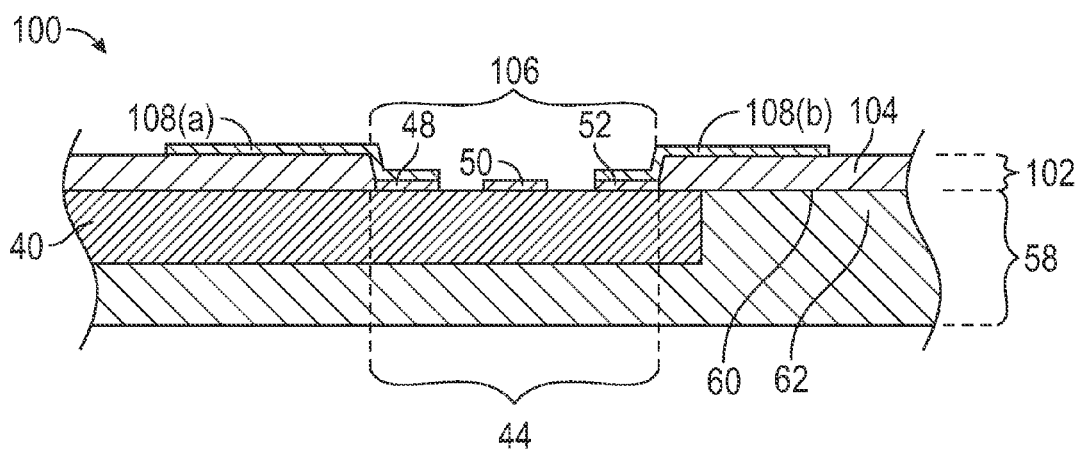
FIGS. 8-11 illustrate a microelectronic package (shown at various stages of completion) containing the semiconductor die shown in FIG. 1 and produced in accordance with a further exemplary embodiment of the package fabrication method.

FIGS. 8-11 illustrate a FO-WLP package 100 containing semiconductor die 40 (FIG. 1), as shown at various stages of completion and fabrication in accordance with a further exemplary embodiment of the present invention. As previously described, semiconductor die 40 has been embedded within a molded panel 58 along with a number of other, non-illustrated microelectronic devices. Molded panel 58 is now subject to additional processing to build a number of RDL layers 102 over the frontside of panel 58 and, therefore, over the frontside of die 40. Build-up of RDL layers 102 commences with the deposition of a first dielectric layer 104 over panel 58 and die 40. As shown in FIG. 8, dielectric layer 104 covers the frontside of die 40 and bond pad rows 48, 50, and 52. As was the case previously, a triple wide trench via 106 is next created within dielectric layer 104 to expose all three bond pad rows 48, 50, and 52 therethrough. After creation of trench via 106, $M_1$ interconnect lines 108(a), 108(b) (collectively 108) are formed in ohmic contact with at least some of the bond pads included within bond pad rows 48 and 52. More specifically, $M_1$ interconnect lines 108 are produced to include a first plurality interconnect lines 108(a), which extend into triple wide trench via 106 to contact inner bond pad row 48; and a second plurality of interconnect lines 108(b), which extend into trench via 106 to contact outer bond pad row 52. In the exemplary embodiment shown in FIGS. 8-11, interconnect lines 108(b) are formed in contact with each of the bond pads within row 52, while interconnect lines 108(a) are formed in contact with some, but not all of the bond pads within row 48.

Figure 9:
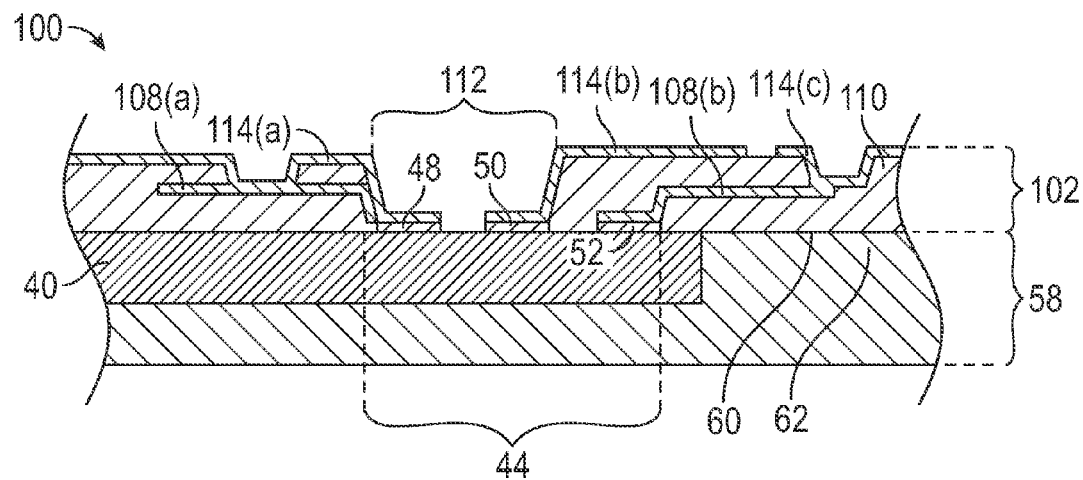
Figure 10:
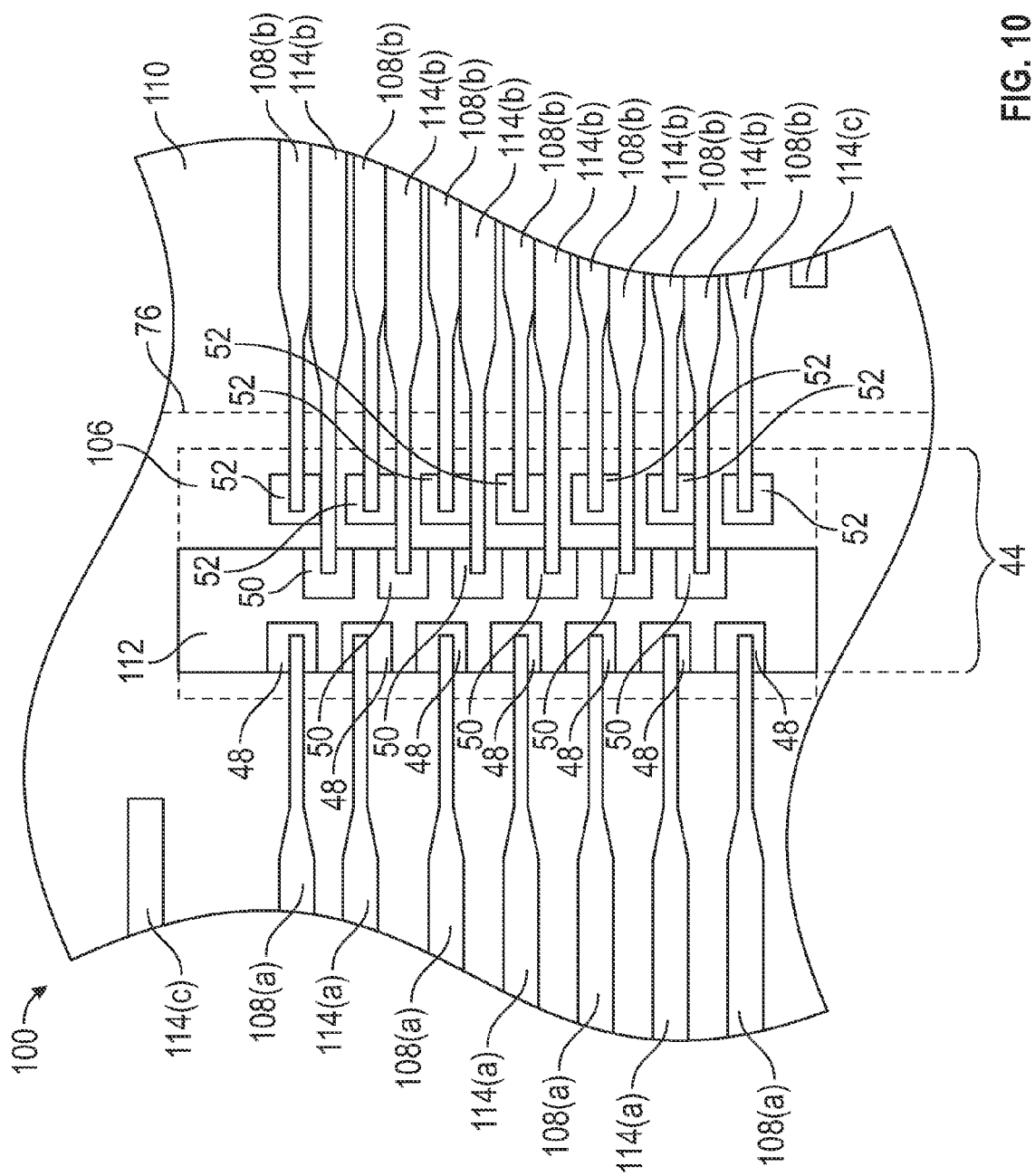

Turning next to FIG. 9, a second dielectric layer 110 is deposited over dielectric layer 104 to cover $M_1$ interconnect lines 108 and fill trench via 106. A second trench via 112 is then created in dielectric layer 110 at a location overlapping with the location at which triple wide trench via 106 was previously produced. Second trench via 112 is produced as a double wide trench via, which exposes inner bond pad row 48 and middle bond pad row 50 through dielectric layer 110, while leaving outer bond pad row 52 covered by layer 110. The respective planform shapes and dimensions of vias 106 and 112 can be compared by referring to FIG. 10, which is a top-down view illustrating the region of FO-WLP package 100 overlying bond pad array 44. The outline of triple wide trench via 106 is represented by a broken line to indicate that via 106 has been filled by dielectric layer 110 at the juncture of manufacture shown in FIG. 10. Additionally, while shown in FIG. 10 for purposes of illustration, it will be appreciated that $M_1$ interconnect lines 108 are covered by dielectric layer 110. In further embodiments, double wide trench via 112 may be formed to expose middle bond pad row 50 and outer bond pad row 52, while leaving inner bond pad row 48 covered by dielectric layer 110.

Figure 11:
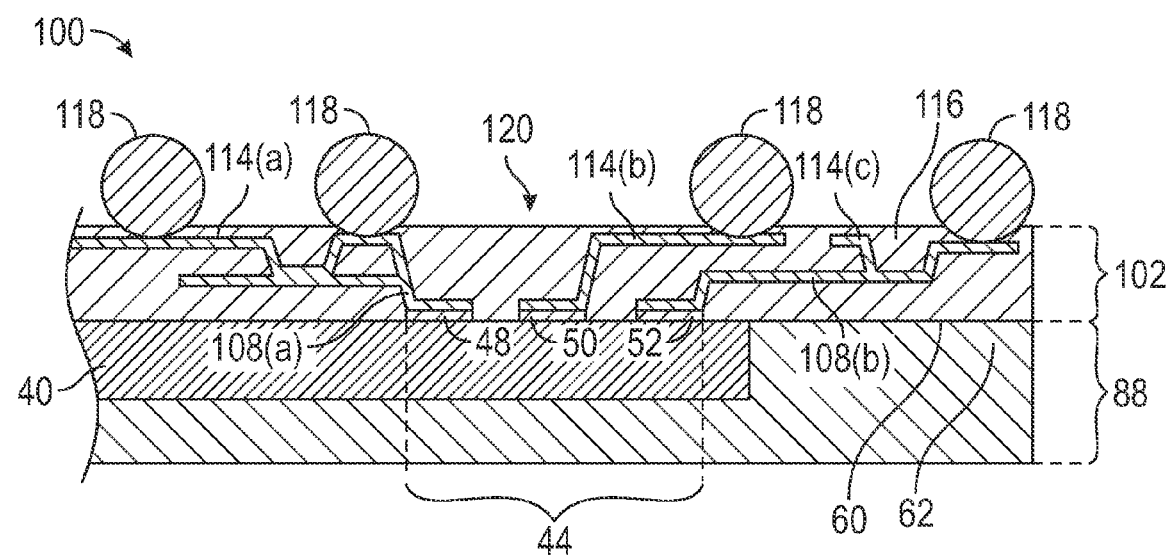

$M_2$ interconnect lines 114(a), 114(b), and 114(c) (collectively 114) are next produced over dielectric layer 110 and extend into double wide trench via 112 to contact bond pad rows 48 and 50. A first plurality of $M_2$ interconnect lines 114(a) may be formed in contact with inner bond pad row 48, while a second plurality of $M_2$ interconnect lines 114(b) is formed in contact with middle bond pad row 50. As shown most clearly in FIG. 10, $M_2$ interconnect lines 114(a) may contact the bond pads within row 48 not already contacted by $M_1$ interconnect lines 108(a). An additional plurality of $M_2$ interconnect lines 114(c) may also be produced, which contact selected regions of the previously-fabricated $M_1$ interconnect lines 108(a) and or 108(b) to further complete the package routing. Afterwards, and referring to FIG. 11, an additional dielectric layer 116 may be deposited over dielectric layer 110 and $M_2$ interconnect lines 114 to fill trench via 112; and a BGA 118 or other contact array may be produced over the topside of FO-WLP package 100 in electrical contact with interconnect lines 114. Finally, molded panel 58 may be singulated to yield a plurality of discrete FO-WLP packages including the completed package 100. As previously noted, singulation of panel 58 defines the sidewalls of the molded package body 88 of package 100. The resultant structure is shown in FIG. 11 wherein the layered interconnect structure is identified by reference numeral "120." As can be seen, interconnect structure 120 has been produced to include interconnect lines formed in conjunction with multiple metal levels (i.e., M1 interconnect lines 108(a) and M2 interconnect lines 114(a) in FIG. 11), which both contact bond pads included within inner bond pad row 48 of array 44.

Figure 12:
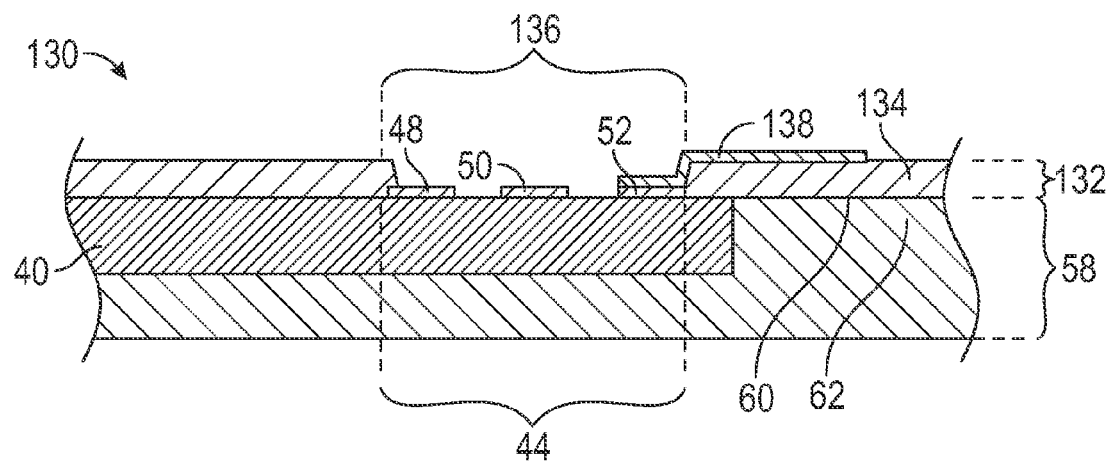
FIGS. 12-16 illustrate a microelectronic package (shown at various stages of completion) containing the semiconductor die shown in FIG. 1 and produced in accordance with a still further exemplary embodiment of the package fabrication method.

In the above-described exemplary embodiments, at least one plurality of interconnect lines was routed inward or inboard of the packaged die (that is, toward the die centerline 54). In certain cases, it may be desirable to route some or all of the interconnect lines in contact with each of bond pad row contained within array 44 outward or outboard of embedded die 40. FIGS. 12-16 illustrate a FO-WLP package 130 containing die 40 (FIG. 1), which may be produced to interconnect lines extending from bond pad rows 48, 50, and 52 in a direction outward from die 40 in accordance with a still further exemplary embodiment of the present invention. Once again, a number of RDL layers 132 are successively built over the frontside 60 of panel 58 beginning with the deposition of a first dielectric layer 134. As shown in FIG. 12, dielectric layer 134 covers frontside of die 40, bond pad array 44, and any other bond pad arrays disposed on die 40. A triple wide trench via 136 is then created within dielectric layer 134 by lithographic patterning to again expose bond pad rows 48, 50, and 52 of array 44. After creation of trench via 136, $M_1$ interconnect lines 138 are produced to extend into trench via 136 and contact outer bond pad row 52. Interconnect lines 138 may further extend from trench via 136 in a direction outward from die 40; that is, away from die centerline 54 identified in FIG. 1.

Figure 13:
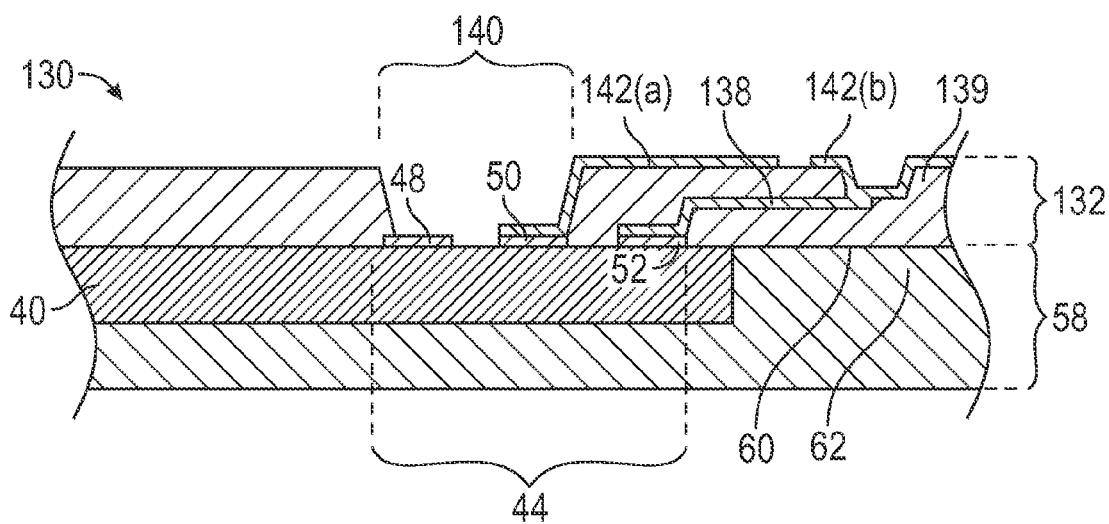
Figure 14:
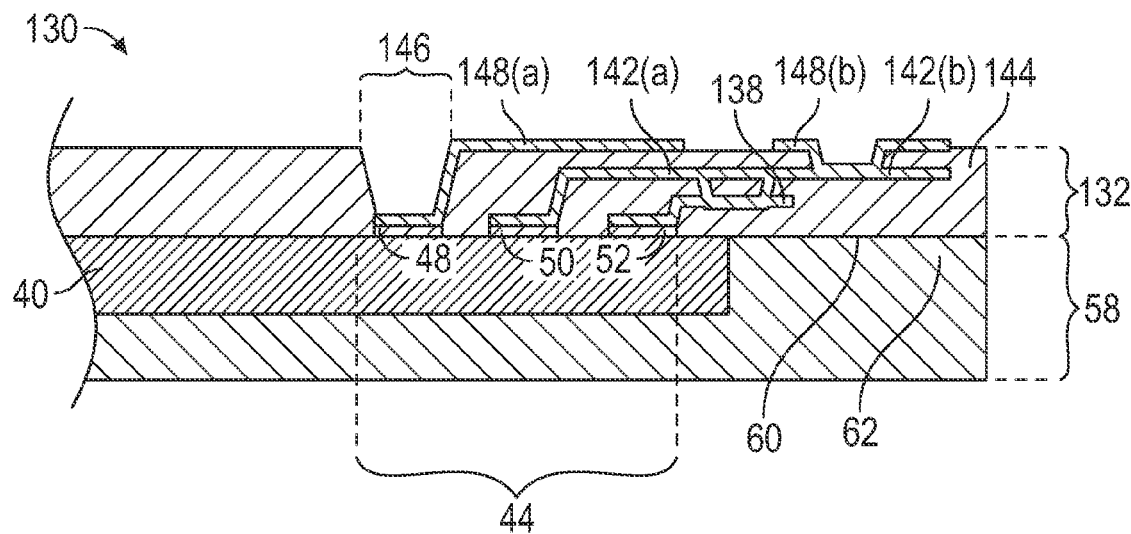
Figure 15:
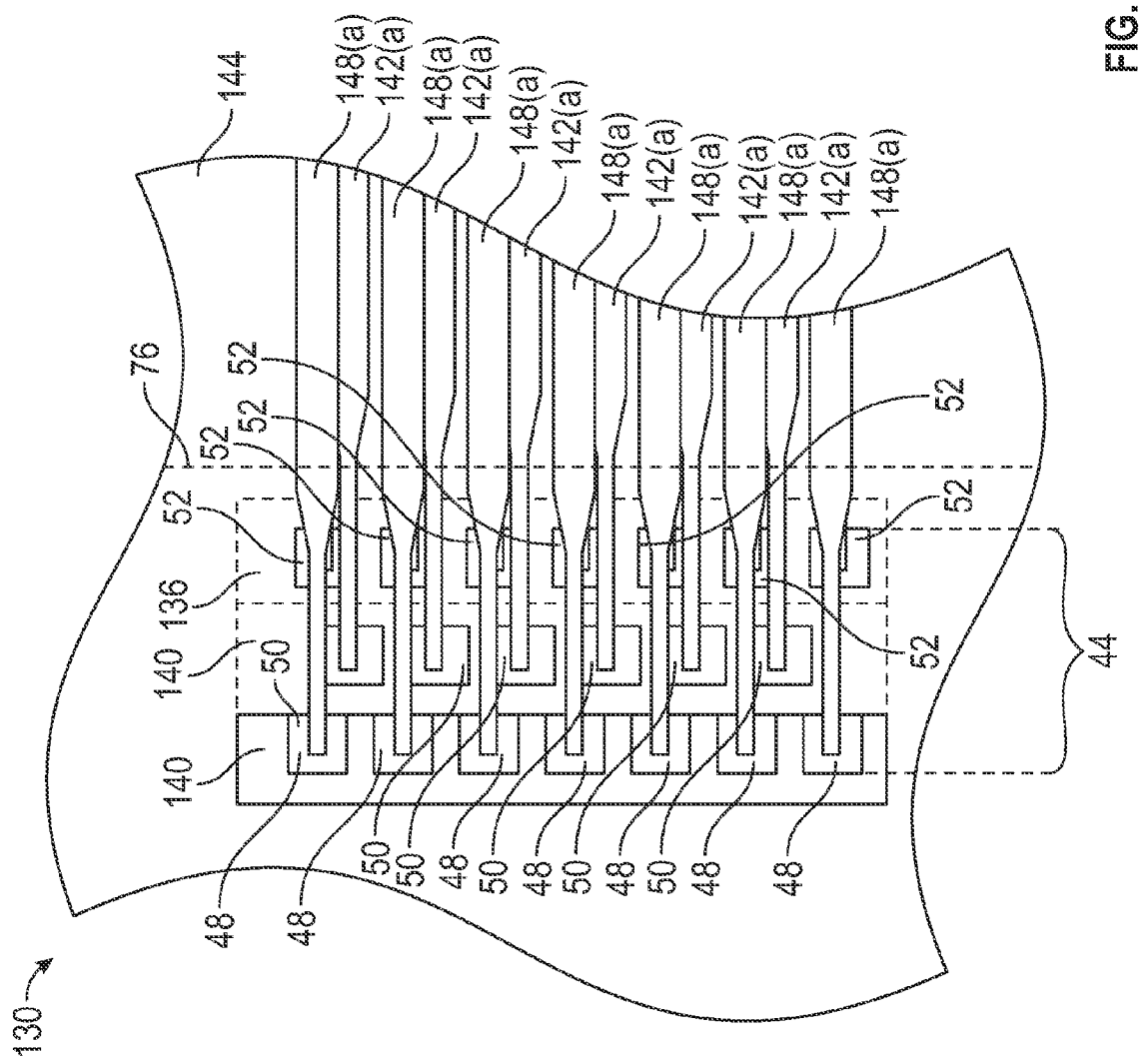
Figure 16:
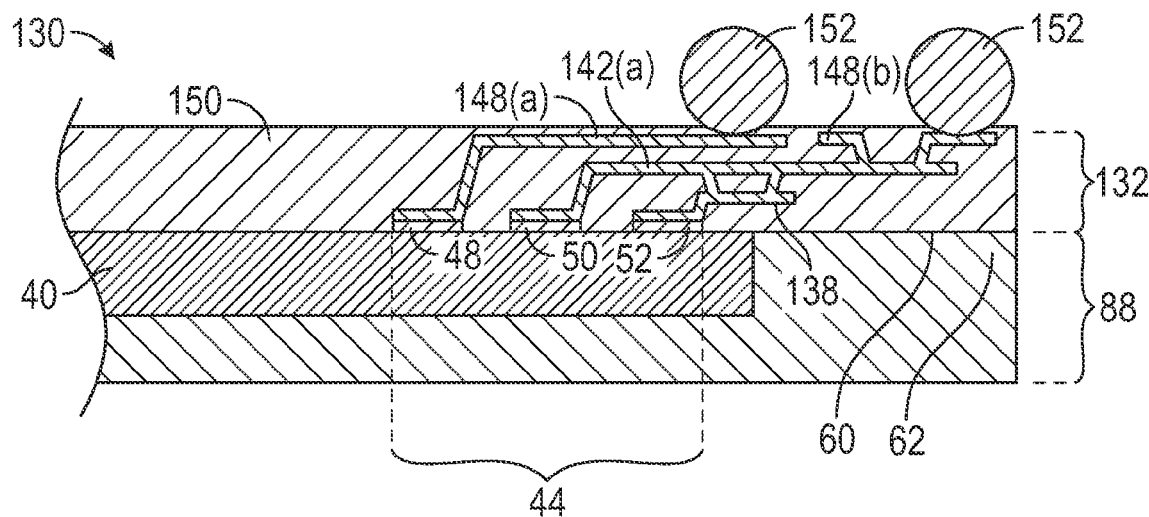

With reference to FIG. 13, a second dielectric layer 139 is next spun-on or otherwise deposited over dielectric layer 134 and $M_1$ interconnect lines 138 to fill triple wide trench via 136 (FIG. 12). A double wide trench via 142 is then created within dielectric layer 139 exposing bond pad rows 48 and 50 therethrough. $M_2$ interconnect lines 142(a) are subsequently formed in contact with middle bond pad row 50 within trench via 142 and extend therefrom in a direction outward of die 40. $M_2$ interconnect lines 142(b) may also be formed in contact with the previously-fabricated $M_1$ interconnect lines 138 to further complete routing of FO-WLP package 130. Afterwards, and referring to FIG. 14, a third dielectric layer 144 is deposited over dielectric layer 139 filling trench via 140. A single wide trench via 146 is then patterned and etched within dielectric layer 144 to expose inner bond pad row 48, while leaving bond pad rows 50 and 52 covered by dielectric material. $M_3$ interconnect lines 148(a) are then produced in ohmic contact with the bond pads of row 48. Additional $M_3$ interconnect lines 148(b) are also be formed in contact with selected $M_1$ interconnect lines 142 and/or 138. As do $M_1$ interconnect lines 138 and $M_2$ interconnect lines 142(a), $M_3$ interconnect lines 148(a) extend in a direction outward of die 40; although in further embodiments at least some of $M_3$ interconnect lines 146 may extend in a direction inward of die 40. The relative locations and dimensions of successively-formed trench vias 136, 140, and 146 are further shown in FIG. 15. The respective outlines of elongated trench vias 136 and 140 are represented by dashed lines in FIG. 15 to indicate that vias 136 and 140 have been filled with dielectric material at the present stage of manufacture. The previously-described processing steps may then be carried-out to complete the fabrication of FO-WLP package 130 and yield the completed package shown in FIG. 16; e.g., a final (e.g., capping or passivation) dielectric layer 150 may be deposited over dielectric layer 144 and $M_3$ interconnect lines 148 thereby filling via 146, a BGA 152 or other contact array may be formed over layer 150 and in contact with selected regions of $M_3$ interconnect lines 148, and molded panel 58 may be singulated to define package body 88.

Figure 17:
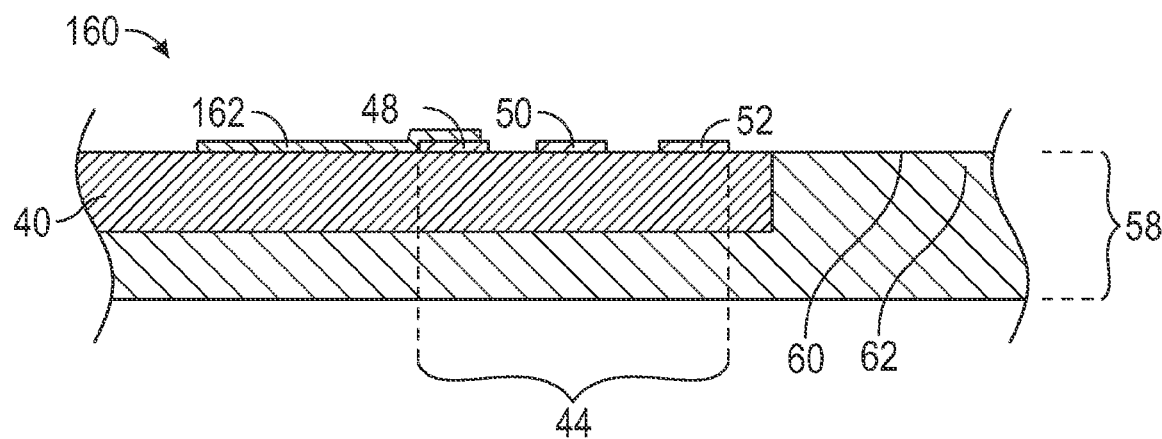
FIGS. 17-19 illustrate a microelectronic package (shown at various stages of completion) containing the semiconductor die shown in FIG. 1 and produced in accordance with a still further exemplary embodiment of the package fabrication method.

In still further embodiments of the packaging method, the layered interconnect structure may include interconnect lines formed prior to deposition of the first RDL dielectric layer (referred to herein as "$M_0$ interconnect lines"). For example, as shown in FIG. 17 wherein the partially-completed microelectronic package is identified by reference numeral "160," a first plurality of $M_0$ interconnect lines 162 may be produced directly on the frontside of die 40 and in contact with inner bond pad row 48. In this case, a non-illustrated passivation layer present on the frontside of semiconductor die 40 may provide electrical isolation between the circuit or circuits carried by die 40 and $M_0$ interconnect lines 162. Although not shown, additional $M_0$ interconnect lines may also be formed in contact with outer bond pad row 52 in further embodiments. As indicated in FIG. 17, $M_0$ interconnect lines 162 can be produced over die 40 (and any other die embedded within panel 58) after panelization. Alternatively, $M_0$ interconnect lines 162 can be formed over semiconductor die 40 during wafer level processing and prior to singulation of the semiconductor wafer from which die 40 is produced.

Figure 18:
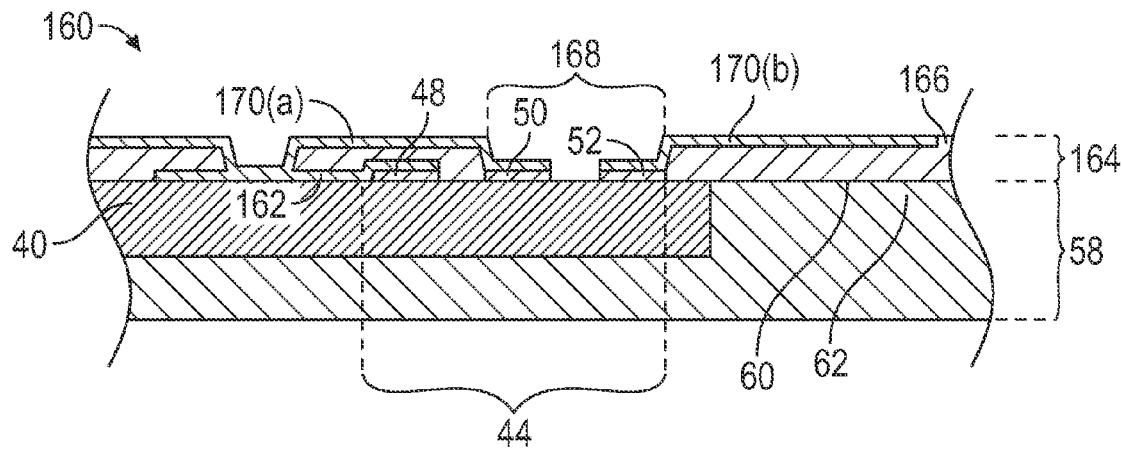
Figure 19:
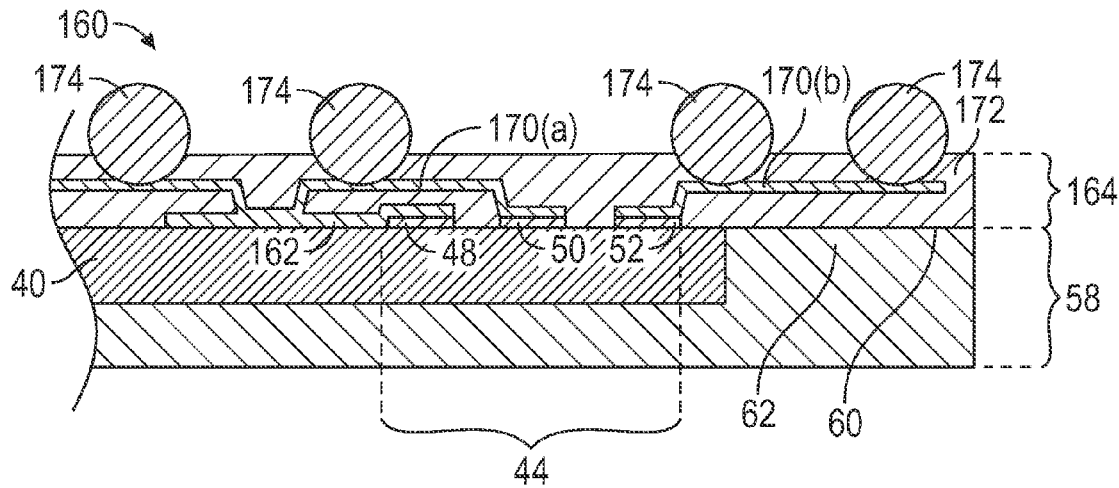

Continuing with the fabrication of FO-WLP package 160, and referring now to FIG. 18, a number of RDL layers 164 is next produced over the frontside 60 of molded panel 58 and, therefore, over die 40. RDL layers 164 include a first dielectric layer 166, which is deposited over molded panel 58 and then patterned to include a double wide trench via 168. Double wide trench via 168 is formed have planform dimensions sufficient to expose bond pad rows 50 and 52 in their substantial entirety. After creation of trench via 168, $M_1$ interconnect lines 170(a) and 170(b) (collectively 170) are produced in ohmic contact with bond pad row 50 and 52 exposed by trench via 168. In particular, a first plurality of $M_1$ interconnect lines 170(a) are produced, which extend into trench via 168 and contact bond pad row 50; and a second plurality of $M_1$ interconnect lines 170(b) are further produced, which extend into trench via 168 and contact bond pad row 52. After formation of $M_1$ interconnect lines 170, and referring to FIG. 19, a final dielectric layer 172 is deposited over dielectric layer 166 thereby filling trench via 168. A BGA 174 or other contact array may then be formed over dielectric layer 172, and the molded panel 58 may be singulated to complete production of FO-WLP Package 160. Thus, by producing the interconnect structure to include $M_0$ interconnect lines 162, the number of processing steps performed during the package fabrication method can be reduced; e.g., as opposed to the fabrication methods described above in conjunction with FIGS. 2-16, only a single trench via need be formed to produce FO-WLP package 160.

Figure 20:
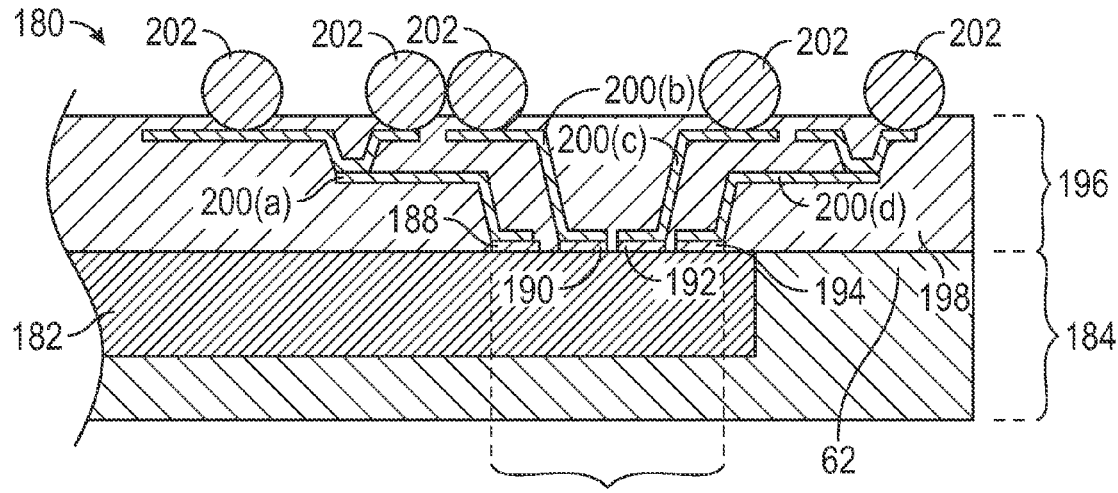
FIGS. 20 and 21 illustrate a microelectronic package (shown at various stages of completion) containing a semiconductor die similar to that shown in FIG. 1 and produced in accordance with a still further exemplary embodiment of the package fabrication method.

The foregoing has thus described several exemplary embodiments of package fabrication methods wherein layered interconnect structures are produced over bond pad arrays containing three adjacent rows of bond pads. As noted above, embodiments of the fabrication method may also be employed to produce layered interconnect structures over bond pad arrays containing only two bond pad rows or bond pad arrays containing four or more rows. In this latter regard, the above-described methods can be modified to interconnect bond pad rows containing four or more adjacent bond pad rows by forming wider trench vias in the dielectric layers and/or by forming the RDL layers to include additional dielectric layers in which progressively smaller trench vias are formed at overlapping locations. Further emphasizing this point, FIG. 20 is a cross-sectional view of a FO-WLP package 180 containing a semiconductor die 182 embedded within a molded package body 184. Die 182 is similar to die 40 described above in conjunction with FIGS. 1-19, but includes at least one bond pad array 186 containing four rows of bond pads 188, 190, 192, and 194 (only one bond pad in each row visible in FIG. 20). A number of RDL layers 196 is formed over the frontside of package body 184 and die 182. RDL layers 196 include a dielectric body 198, which may be formed as a number of successively-deposited layers of dielectric material, a number of interconnect lines 200, which provide electrical interconnect between bond pad rows 188, 190, 192, and 194, and a BGA 202 formed over the package topside. In this case, interconnect lines 200 are formed to include first, second, third, and fourth pluralities of interconnect lines 200(a)-(d) in contact with bond pad rows 188, 190, 192, and 194, respectively.

Figure 21:
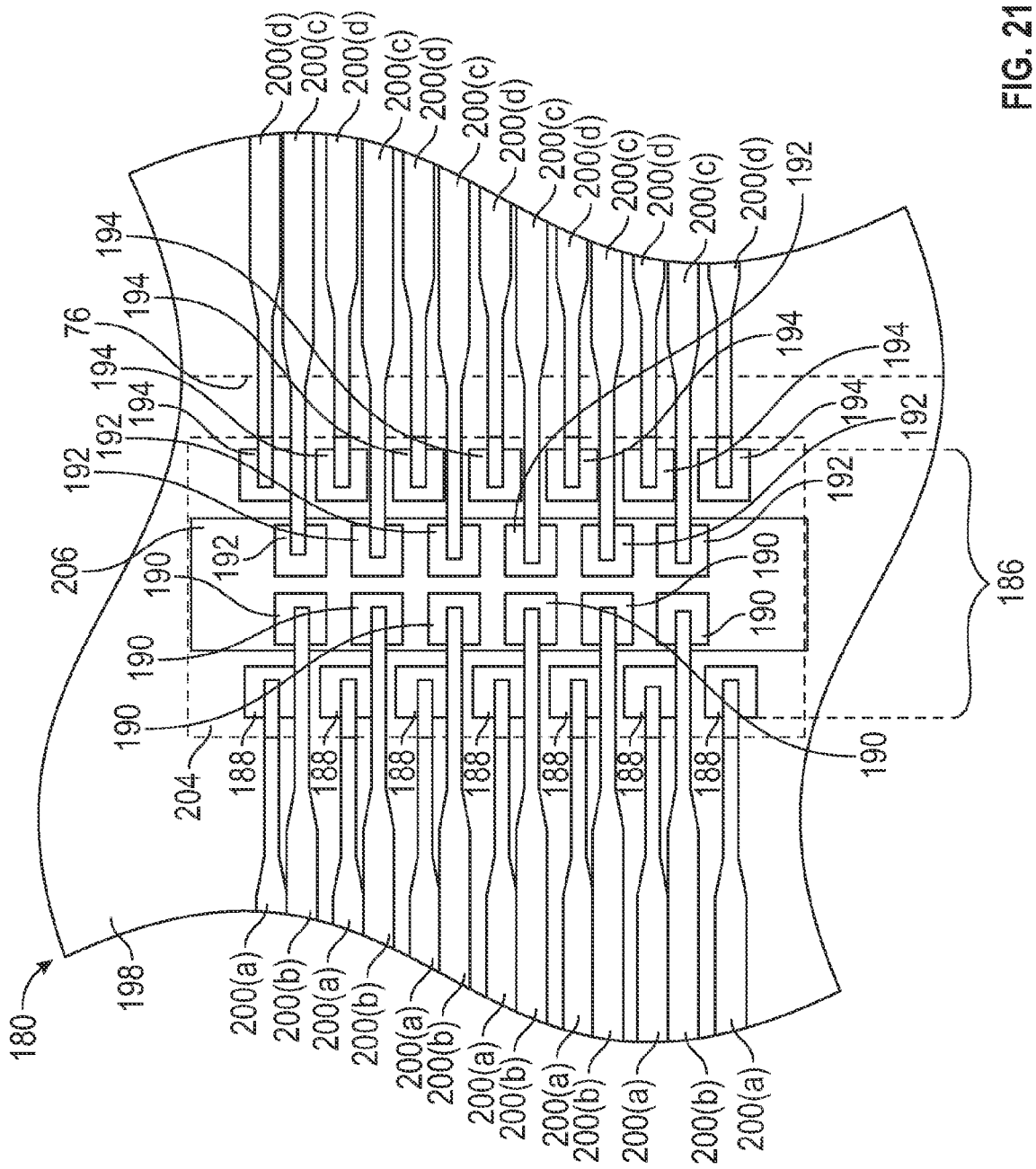

During fabrication of FO-WLP package 180 shown in FIG. 20, the interconnect structure overlying bond pad array 186 may be fabricated in a manner similar to that utilized to produce the interconnect structure of FO-WLP package 66 described above in conjunction with FIGS. 2-8. However, in the case of package 180, the first-formed trench via is produced to have a width sufficient to expose all four rows of bond pads included within bond pad array 186, and the second-formed trench via is produced to have a width sufficient to expose the middle two rows 190 and 192 within array 186. This may be more fully appreciated by referring to FIG. 21, which illustrates the location at which a first quadruple width trench via 204 may be formed in an initially-deposited dielectric layer and the location at which a second double wide trench via 206 may formed in a subsequently-deposited dielectric layer. As indicated in FIG. 21, quadruple wide trench via 204 permits interconnect lines 200(*a*) and 200(*d*) to be formed in ohmic contact with terminal bond pad rows 188 and 194, respectively; while double wide trench via 206 permits interconnect lines 200(*b*) and 200(*c*) to be formed in ohmic contact with middle bond pad rows 190 and 192, respectively. This results in the production of a layered interconnect structure providing electrical communication with middle bond pad rows 190 and 192, regardless of the pitch of terminal bond pad rows 188 and 194. In this case, the interconnect structure is "layered" in the sense that interconnect lines 200(*b*) extend over interconnect lines 200(*a*) and inner bond pad row 188 in progressing inward of die 182, while interconnect lines 200(*c*) extend over interconnect lines 200(*d*) and outer bond pad row 194 in progressing outward of die 182.

The foregoing has thus provided multiple exemplary embodiments of a method for fabricating microelectronic packages including layered interconnect structures overlying and interconnected with multi-row bond pad arrays. Embodiments of the above-described fabrication method can be utilized to package any microelectronic device containing at least two neighboring rows of bond pads. However, embodiments of the above-described fabrication method are advantageously employed to produce interconnect structures over bond pad arrays containing three or more rows of bond pads characterized by a fine pitch. Embodiments of the above-described fabrication method may also enable the formation of direct electrical connections between the bond pads and interconnect lines overlying the $M_1$ metal level within the RDL layers, and/or provide the ability to form direct electrical connections between one or more bond pads within a given bond pad row and interconnect lines formed in conjunction with varying metal levels.

In one embodiment, the fabrication method includes the steps or processes of forming a first plurality of interconnect lines in ohmic contact with a first bond pad row disposed on a semiconductor die; depositing a dielectric layer over the first plurality of interconnect lines, the first bond pad row, and a second bond pad row disposed on the semiconductor die adjacent the first bond pad row; creating a trench via exposing at least the second bond pad row through the dielectric layer; and forming a second plurality of interconnect lines in ohmic contact with the second bond pad row within the trench via, the second plurality of interconnect lines extending over the first bond pad row and electrically isolated therefrom by the dielectric layer to at least partially produce a layered interconnect structure. This fabrication method is generic to the exemplary fabrication processes described above in conjunction with FIGS. 1-21. Referring briefly to the figures, the first bond pad row may correspond to bond pad row 48 or 52 (shown in FIGS. 1-3, 5, 7-9, 11-14, and 16-20), while the second bond pad row may correspond to bond pad row 50 (also shown in the aforementioned figures). The first plurality of interconnect lines may correspond to any set of interconnect lines shown in FIGS. 1-21 in ohmic contact with bond pad row 48 or 52; and the second plurality of interconnect lines may correspond to any set of interconnect lines shown in FIGS. 1-21 in ohmic contact with bond pad row 50. The dielectric layer may correspond to any dielectric layer shown in FIGS. 1-21 included within the RDL layers deposited over the bond pad rows and at least one set of interconnect lines, and the trench via may correspond to any via shown in FIGS. 1-21 created in an RDL dielectric layer and exposing at least bond pad row 48 or 52.

In a further embodiment, the method includes obtaining a molded panel in which a semiconductor die has been embedded, wherein the term "obtaining" encompasses purchasing or otherwise acquiring the molded panel from a third party supplier, as well as independently manufacturing the molded panel utilizing, for example, a pour molding, compression, or injection molding process of the type described above. The semiconductor die is produced to include at least one multi-row bond pad array thereon. Redistribution layers are fabricated or built-up over a frontside of the molded panel through which the semiconductor die is exposed. The molded panel is then singulated to yield a completed microelectronic package having a molded package body in which the semiconductor die is embedded. During build up of the redistribution layers, a layered interconnect structure is produced over the multi-row bond pad array. The layered interconnect structure may include a first plurality of interconnect lines, which ohmically contact the multi-row bond pad array (that is, contact at least one bond pad included within the array); and a second plurality of interconnect lines, which also ohmic contacts the multi-row bond pad array. The first and second pluralities of interconnect lines are formed at different levels within the redistribution layers; the phrase "formed at different levels within the redistribution layers" denoting that the interconnect lines are produced in conjunction with different metal levels of the RDL layers and, therefore, that the interconnect lines predominately extend along planes co-planar with the die frontside surface and located at different elevations within the RDL layers with the exception of the terminal end portions or other portions of the interconnect lines extending toward the die frontside to contact bond pads included within one or more bond pad rows, as previously described.

The foregoing has also provided embodiments of a microelectronic package, such as a FO-WLP package. In one embodiment, the package includes a semiconductor die having a first bond pad row and a second bond pad row adjacent the first bond pad row. The semiconductor die is embedded in a molded body, and a plurality of redistribution layers is formed over the semiconductor die and the molded body. The plurality of redistribution layers may include a first dielectric layer deposited over the semiconductor die and the molded body, a first plurality of interconnect lines in ohmic contact with the first bond pad row, and a second plurality of interconnect lines in ohmic contact with the second bond pad row. The second plurality of interconnect lines extends over the first bond pad row and is electrically isolated therefrom by a region of the first dielectric layer. In certain embodiments, the semiconductor die may further include a third bond pad row adjacent the second bond pad row, the second bond pad row disposed between the first and third bond pad rows. In this case, the plurality of redistribution layers may further include a third plurality of interconnect lines in ohmic contact with the third bond pad row. The third plurality of interconnect lines may be located at the same level in the redistribution layers as is either the first or second plurality of interconnect lines. Alternatively, the third plurality of interconnect lines may be located at a level above both the first and second plurality of interconnect lines.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims. Numerical identifiers, such as "first," "second," "third," and the like have been used above in accordance with the order in which elements (e.g., interconnect lines, vias, and RDL dielectric layers) were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction.

What is claimed is:

1. A method for fabricating a microelectronic package comprising: forming a first plurality of interconnect lines in ohmic contact with a first bond pad row disposed on a semiconductor die; depositing a dielectric layer over the first plurality of interconnect lines, the first bond pad row, a second bond pad row disposed on the semiconductor die adjacent the first bond pad row, and a third bond pad row, the second bond pad row disposed between the first and third bond pad rows; creating a trench via exposing at least the second bond pad row through the dielectric layer; forming a second plurality of interconnect lines in ohmic contact with the second bond pad row within the trench via, the second plurality of interconnect lines extending over the first bond pad row and electrically isolated therefrom by the dielectric layer to at least partially produce a layered interconnect structure; and forming a third plurality of interconnect lines in ohmic contact with the third bond pad row.

2. The method of claim 1 further comprising:
embedding the semiconductor die in a molded panel; and
singulating the molded panel to produce a molded panel body surrounding the semiconductor die;
wherein forming a first plurality of interconnect lines, depositing a dielectric layer, creating a trench via, and forming a second plurality of interconnect lines are performed prior to singulation of the molded panel.

3. The method of claim 1 wherein the first, second, and third bond pad rows each have a pitch less than 100 microns.

4. The method of claim 1 wherein creating a trench via comprises creating a trench via exposing at least the second and third bond pad rows through the dielectric layer.

5. The method of claim 4 wherein the trench via further exposes the first bond pad row through the dielectric layer.

6. The method of claim 1 wherein the semiconductor die has a die centerline; and
wherein at least some of the second plurality of interconnect lines extend from the trench in a direction away from the die centerline.

7. The method of claim 6 wherein at least some of the second plurality of interconnect lines extend from the trench in a direction toward the die centerline.

8. The method of claim 1 wherein depositing a dielectric layer comprises depositing a second dielectric layer over the first plurality of interconnect lines, the first bond pad row, and the second bond pad row; and
wherein the method further comprises depositing a first dielectric layer over the first and second bond pad rows prior to depositing the second dielectric layer.

9. The method of claim 8 wherein creating a trench via comprises creating a second trench via through the second dielectric layer exposing at least the second bond pad row; and
wherein the method further comprises creating a first trench via through the first dielectric layer exposing the first and second bond pad rows prior to forming the second trench via.

10. The method of claim 9 wherein the semiconductor die further comprises a third bond pad row, and the second bond pad row is disposed between the first and third bond pad rows;
wherein creating a first trench via comprises creating a first trench via through the first dielectric layer exposing the first, second, and third bond pad rows;
wherein depositing a second dielectric layer comprises depositing a second dielectric layer over the first plurality of interconnect lines, the first bond pad row, the second bond pad row, and the third bond pad row; and
wherein creating a second trench via comprises forming a second trench via through the second dielectric layer exposing the second bond pad row, while preventing exposure of at least one of the first and third bond pad rows.

11. The method of claim 1 wherein forming a first plurality of interconnect lines comprises forming a first plurality of interconnect lines directly on the semiconductor die.

12. A method of fabricating a microelectronic package, comprising: obtaining a molded panel in which a semiconductor die has been embedded, the semiconductor die having a multi-row bond pad array located thereon; building UP redistribution layers over a frontside of the molded panel through which the semiconductor die is exposed; and singulating the molded panel to yield a completed microelectronic package having a molded package body in which the semiconductor die is embedded; wherein, during build up of the redistribution layers, a layered interconnect structure is produced over the multi-row bond pad array comprising: a first plurality of interconnect lines contacting at least one bond pad in a first bond pad row of the multi-row bond pad array; a second plurality of interconnect lines contacting at least one bond pad in a second bond pad row of the multi-row bond pad array, the first and second pluralities of interconnect lines formed at different levels within the redistribution layers; and a third plurality of interconnect lines contacting at least one bond pad located in a third bond pad row of the multi-row bond pad array disposed between the first and second bond pad rows.

13. The method of claim 12 further comprising producing a contact array over the redistribution layers prior to singulation of the molded panel, the layered interconnect structure electrically coupling the semiconductor die to the contact array.

14. The method of claim 12 wherein the multi-row bond pad array comprises a first bond pad row and a second bond pad row adjacent the first bond pad row;
wherein the first plurality of interconnect lines is produced in direct ohmic contact with the first bond pad row; and
wherein the second plurality of interconnect lines is produced in direct ohmic contact with the second bond pad row.

15. The method of claim 14 wherein, during build up of the redistribution layers, the layered interconnect structure is at least partially produced by:
depositing a dielectric layer over the molded panel covering the first bond pad row, the second bond pad row, and the first plurality of interconnect lines;
creating a trench via in the dielectric layer exposing the second bond pad row; and
forming the second plurality of interconnect lines over the dielectric layer and extending into the trench via to contact the second bond pad row.

16. The method of claim 15 wherein depositing a dielectric layer comprises depositing a second dielectric layer over the molded panel covering the first bond pad row, the second bond pad row, and the first plurality of interconnect lines;

wherein creating a trench via comprises creating a second trench via in the second dielectric layer exposing the second bond pad row; and wherein, during build up of the redistribution layers, the layered interconnect structure is further at least partially produced by:

depositing a first dielectric layer over the molded panel covering the first and second bond pad rows;

creating a first trench via in the first dielectric layer exposing the first and second bond pad rows; and forming the second plurality of interconnect lines over the dielectric layer and extending into the first trench via to contact the first bond pad row.

17. A microelectronic package, comprising: a semiconductor die having a first bond pad row, a second bond pad row adjacent the first bond pad row, and a third bond pad row adjacent the second bond pad row, the second bond pad row disposed between the first and third bond pad rows; a molded body in which the semiconductor die is embedded; a plurality of redistribution layers formed over the semiconductor die and the molded body, the plurality of redistribution layers comprising: a first dielectric layer deposited over the semiconductor die and the molded body; a first plurality of interconnect lines in ohmic contact with the first bond pad row; a second plurality of interconnect lines in ohmic contact with the second bond pad row, the second plurality of interconnect lines extending over the first bond pad row and electrically isolated therefrom by a region of the first dielectric layer; and a third plurality of interconnect lines in ohmic contact with the third bond pad row.

18. The microelectronic package of claim 17 wherein the first, second, and third bond pad rows each have a pitch less than 100 microns.

19. The microelectronic package of claim 17 wherein the semiconductor die has a die centerline, and wherein at least some of the interconnect lines included in the second plurality of interconnect lines extend away from the die centerline in a first direction, while other interconnect lines included in the second plurality of interconnect lines extend away from the die centerline in a second, opposing direction.

20. The microelectronic package of claim 17 wherein the first plurality of interconnect lines extend along and contact a surface of the semiconductor die.

* * * * *